US008581759B2

(12) United States Patent
Booth et al.

(10) Patent No.: US 8,581,759 B2
(45) Date of Patent: Nov. 12, 2013

(54) VERNIER PHASE TO DIGITAL CONVERTER FOR A ROTARY TRAVELING WAVE OSCILLATOR

(75) Inventors: Richard W. D. Booth, San Jose, CA (US); Koji Takinami, Kanagawa (JP)

(73) Assignee: Panasonic Corporation, Osaka (JP)

( * ) Notice: Subject to any disclaimer, the term of this patent is extended or adjusted under 35 U.S.C. 154(b) by 95 days.

(21) Appl. No.: 13/448,927

(22) Filed: Apr. 17, 2012

(65) Prior Publication Data
US 2013/0271190 A1 Oct. 17, 2013

(51) Int. Cl.
*H03M 1/00* (2006.01)

(52) U.S. Cl.
USPC .............................. 341/111; 327/156; 331/1 A

(58) Field of Classification Search
USPC ..................................... 341/111; 331/1 A, 25
See application file for complete search history.

(56) References Cited

U.S. PATENT DOCUMENTS

| 7,907,023 B2 * | 3/2011 | Liang et al. ..................... 331/45 |
| 8,106,808 B1 * | 1/2012 | Cohen et al. ................. 341/166 |
| 8,164,493 B2 * | 4/2012 | Hsieh ............................. 341/110 |
| 8,222,939 B2 * | 7/2012 | Takinami et al. .............. 327/159 |
| 2008/0211589 A1 * | 9/2008 | Sano .............................. 331/55 |
| 2012/0112841 A1 * | 5/2012 | Hayashi ............................ 331/2 |

* cited by examiner

Primary Examiner — Howard Williams

(57) ABSTRACT

A phase to digital conversion circuit with improved resolution for a rotary traveling wave oscillator. The phase to digital conversion circuit connects with a closed loop transmission line via a plurality of signal lines or nodes distributed along the transmission line. As an oscillating signal propagates around the transmission line, a time waveform of the signal at each of the plurality of signal lines is transmitted to a corresponding plurality of latches. Upon a triggering condition, the plurality of latches simultaneously samples the signals from the plurality of signal lines. At least two reference clock signals are switchably coupled with the plurality of latches latch for triggering the plurality of latches based on an edge transition in each of the reference clock signals compared with an edge transition in each of the signals from the plurality of taps.

20 Claims, 5 Drawing Sheets

VERNIER PHASE TO DIGITAL CONVERTER FOR A ROTARY TRAVELING WAVE OSCILLATOR

BACKGROUND

1. Field

The present invention relates generally to improvements in phase to digital conversion circuits and more particularly pertains to higher resolution Vernier phase to digital converters for rotary traveling wave oscillators and improvements thereto.

2. Description of the Related Art

The incorporation of analog circuitry into CMOS-based devices has resulted in a variety of problems as the analog components utilized scale. Many times, a particular device design must be redone for each new analog technology sought to be used. Digital circuitry on the other hand has resulted in far fewer issues since digital designs generally scale with the technology. Thus, it is becoming increasingly popular to replace as much analog circuitry as possible with digital equivalents. Radio frequency circuits, such as phase locked loops, particularly benefit from the use of all digital components.

One type of all digital phase locked loop utilizes a rotary traveling wave oscillator for generating an oscillating signal and phase to digital conversion circuitry for monitoring the characteristics of the oscillating signal. Phase to digital conversion circuits allow for an estimation of the phase of a particular signal connected thereto. The phase to digital conversion circuit receives a plurality of pulsed signals tapped off of a main signal, the plurality of pulsed signals simultaneously sampled in order to generate a digital representation of the phase of the main signal. This digital representation of phase can then be decoded by decoding logic and/or input to other connected systems, for example to adjust or tune certain aspects of the main signal.

Unfortunately, traditional phase to digital converters for rotary traveling wave oscillators are forced to trade phase quantization or resolution for increased performance in the operation of the oscillators or other circuitry. Such diminished resolution lends to inaccuracies in the precise determination of the phase component of the oscillator. While the resolution may be increased through the tapping of additional signals off of the oscillator for transmittal to the phase to digital converter or through the use of high frequency clocking signals, such solutions come at a significant cost due to increased circuit complexity, increased current consumption and degraded circuit performance. In some circumstances, the use of additional signal taps may even prove impossible due to physical circuit constraints for proper operation of the oscillator.

Thus, a method or apparatus for more accurately detecting a phase component of an oscillator is desired. The method or apparatus would desirably be capable of increasing the phase quantization or resolution to potentially unlimited levels, but remain at a low circuit cost. The method or apparatus would desirably be capable of connecting with a rotary traveling wave oscillator and more accurately estimating the phase of the oscillator without requiring additional signal taps be added or connected with the oscillator. Similarly, the method or apparatus would allow such increases in phase quantization or resolution without substantially increasing the power consumption or circuit complexity when compared to traditional phase to digital converters.

SUMMARY

An apparatus and method for a high resolution Vernier phase to digital conversion circuit for a rotary traveling wave oscillator is disclosed. In one embodiment, a phase to digital conversion circuit may include an input line for conducting an input signal, the input signal having a transition and a latch having a first terminal, a second terminal and a third terminal, the first terminal of the latch coupled with the signal line for receiving the input signal. A first reference signal line for conducting a first reference signal is switchably coupled with the second terminal of the latch. A second reference signal line for conducting a second reference signal is switchably coupled with the second terminal of the latch. An output signal line is coupled with the third terminal of the latch for conducting a latched signal based on the input signal, the latched signal configured to be updated based on a transition in the first reference signal or a transition in the second reference signal.

In another embodiment, a phase to digital converter for a rotary traveling wave oscillator may include an oscillator having a closed loop transmission path. While only four signal circuit nodes are described below for the embodiment, alternative phase to digital converters for a rotary traveling wave oscillator may generally include a greater number of signal circuit nodes for tapping the oscillator. A first signal circuit node located at a first location on the transmission path for receiving a first tapped signal, a second signal circuit node located at a second location on the transmission path for receiving a second tapped signal, a third signal circuit node located at a third location on the transmission path for receiving a third tapped signal and a fourth signal circuit node located at a fourth location on the transmission path for receiving a fourth tapped signal. A first flip-flop having a first port, a second port and a third port its first port electrically connected with the first signal circuit node. A second flip-flop having a first port, a second port and a third port has its first port electrically connected with the second signal circuit node. A third flip-flop having a first port, a second port and a third port has its first port electrically connected with the third signal circuit node. A fourth flip-flop having a first port, a second port and a third port has its first port electrically connected with the fourth signal circuit node. A clocking signal circuit node is electrically connected with the second port of the first flip-flop, the second port of the second flip-flop, the second port of the third flip-flop and the second port of the fourth flip-flop. At least one switch is electrically connected to the clocking signal circuit node for switchably conducting a first clocking signal or a second clocking signal to the clocking signal circuit node. A first output signal circuit node is electrically connected with the third port of the first flip-flop for receiving a first latched signal based on the first tapped signal, a second output signal circuit node is electrically connected with the third port of the second flip-flop for receiving a second latched signal based on the second tapped signal, a third output signal circuit node is electrically connected with the third port of the third flip-flop for receiving a third latched signal based on the third tapped signal and a fourth output signal circuit node electrically connected with the third port of the fourth flip-flop for receiving a fourth latched signal based on the fourth tapped signal. The at least one switch is configured to conduct the first clocking signal to the clocking signal circuit node based on a first transition between a low state and a high state in the first clocking signal and a transition between a low state and a high state in the second clocking signal.

In yet another embodiment, a method of increasing a resolution of phase to digital conversion for a rotary traveling wave oscillator may include the steps of providing a tapped signal circuit node, a first reference signal circuit node and a second reference signal circuit node, providing a latch having a first terminal, a second terminal and a third terminal, the first terminal of the latch connected to the tapped signal circuit node, receiving a tapped signal on the tapped signal circuit node, the tapped signal having a transition edge located at a first transition time, receiving a first reference signal on the first reference signal circuit node, the first reference signal having a transition edge located at a second transition time, receiving a second reference signal on the second reference signal circuit node, the second reference signal having a transition edge located at a third transition time, connecting the first reference signal circuit node to the second terminal of the latch based on the first transition time, the second transition time and the third transition time and outputting a latched signal based on the tapped signal from the third terminal of the latch at the second transition time.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Figure 1:
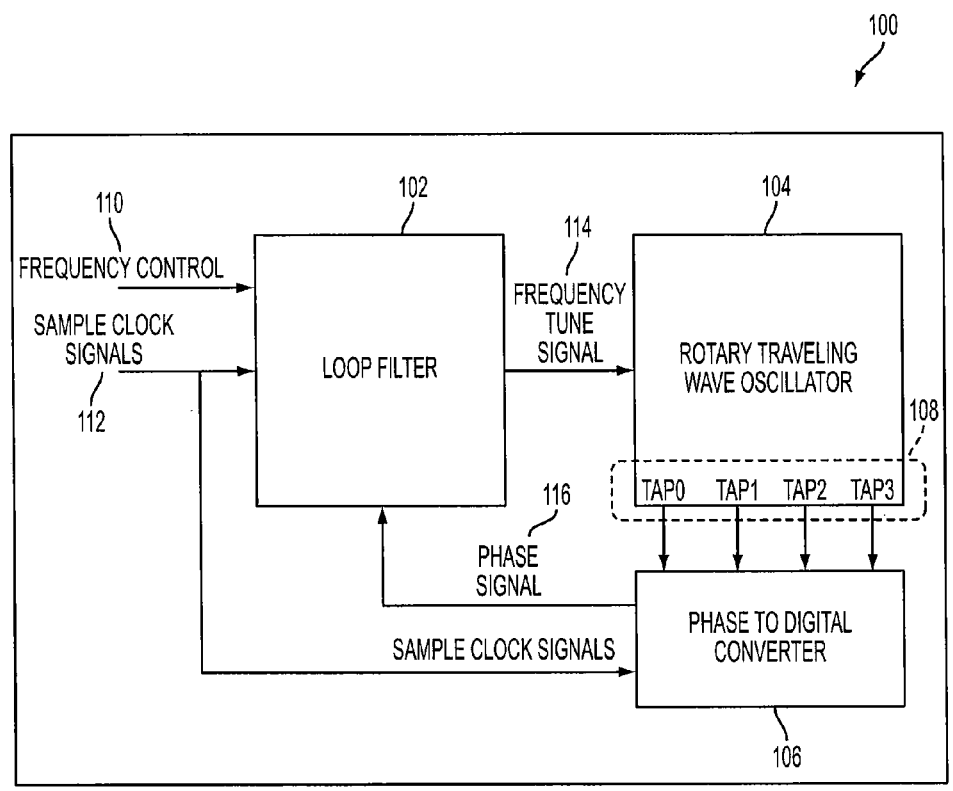
FIG. 1 is a block diagram of an all digital phase locked loop utilizing a rotary traveling wave oscillator connected with a phase to digital converter in accordance with an embodiment of the invention.

In reference to FIG. 1, a block diagram is shown of an all digital phase locked loop 100 utilizing a rotary traveling wave oscillator 104 connected with a phase to digital converter 106. All digital phase locked loops are increasingly desired as CMOS based systems and equipment become ever more prevalent in commercial and industrial applications. Traditional integration of analog phase locked loops ("PLLs") into digital circuitry is problematic due to their susceptibility to noise and the process variations that occur during manufacturing. Digital PLLs avoid these problems and concerns. The all digital phase locked loop 100 incorporates particular phase to digital conversion circuitry for providing an increased resolution, lending to a more accurate all digital phase locked loop than may traditionally be obtained.

The rotary traveling wave oscillator 104 of the all digital phase locked loop 100 generates an oscillating signal that travels around a closed loop transmission path, as discussed in greater detail herein. The phase to digital converter 106 of the all digital phase locked loop 100 receives a plurality of tapped signals off of the closed loop transmission path of the rotary traveling wave oscillator 104 via a plurality of signal taps 108, as discussed in greater detail herein. The phase to digital converter 106 also receives a plurality of sample clock signals 112 and operates to sample the plurality of tapped signals in accordance with the sample clock signals 112 in order to generate a digital representation of a phase of the rotary traveling wave oscillator 104.

The phase to digital converter 106 utilizes this digital representation to output a digital phase signal 116 to a loop filter 102 of the all digital phase locked loop 100. The loop filter 102 operates to provide tuning capabilities for the rotary traveling wave oscillator 104. For example, the rotary traveling wave oscillator 104 may begin to generate an oscillating signal with a different operating frequency than is desired. The loop filter 102 is configured to generate and provide a frequency tune signal 114 to the rotary traveling wave oscillator 104 in order to correct such deviations from its desired operating characteristics. The loop filter 102 uses the phase signal 116, a frequency control signal 110 and the sample clock signals 112 to determine the appropriate frequency tune signal 114 for provision to the rotary traveling wave oscillator 104. By incorporating the phase to digital converter 106 with improved resolution in determining a phase of the rotary traveling wave oscillator 104, more accurate feedback may be provided to the loop filter 102 for tuning of the rotary traveling wave oscillator 104.

Figure 2:
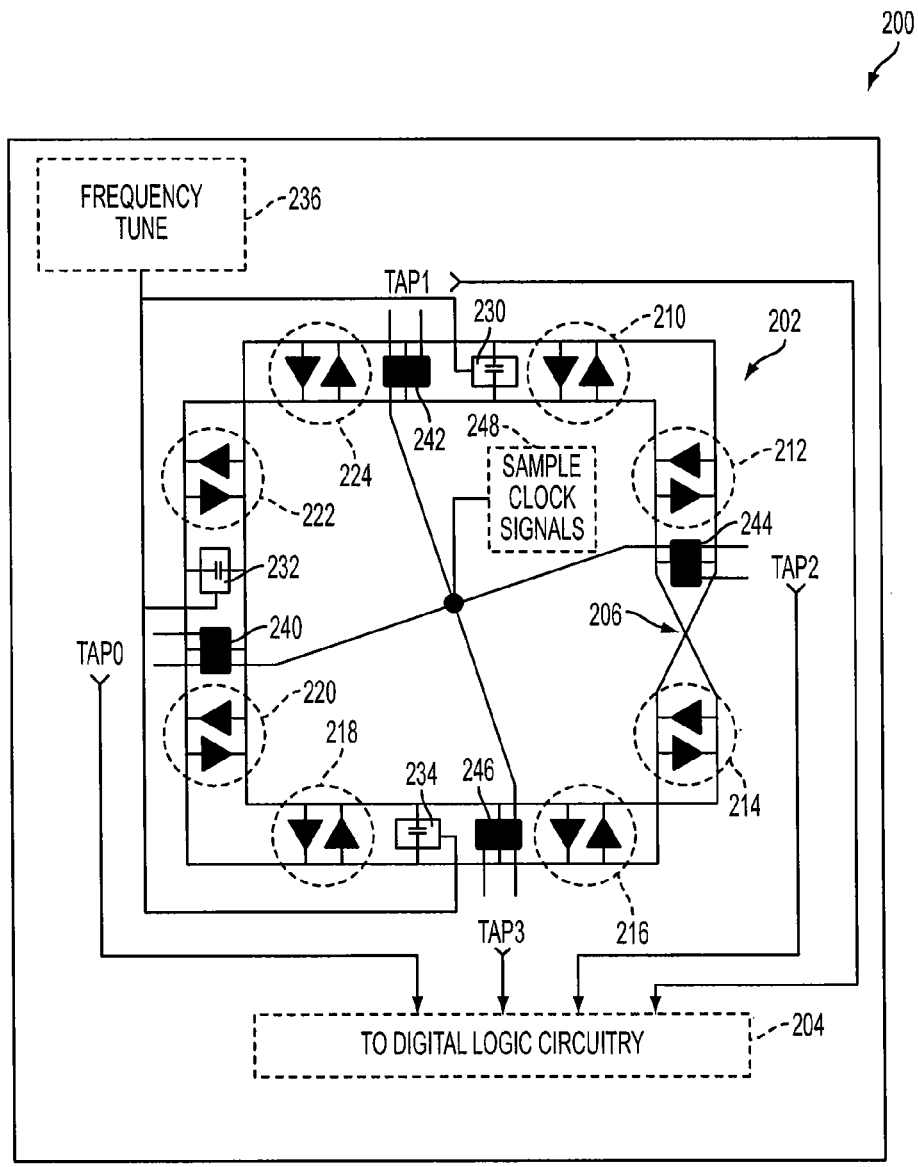
FIG. 2 is a schematic circuit diagram of a rotary traveling wave oscillator for connection with a phase to digital converter in accordance with an embodiment of the invention.

Referring next to FIG. 2, a schematic circuit diagram of a rotary traveling wave oscillator 200 for generating an oscillating signal is shown and includes phase to digital sampling circuitry. The rotary traveling wave oscillator 200 may be the same or similar to the rotary traveling wave oscillator 104 and the phase to digital converter 106 of FIG. 1. The rotary traveling wave oscillator is configured for connection to digital logic circuitry 204. As discussed in greater detail herein, the digital logic circuitry 204 interfaces with the phase to digital sampling circuitry for determining the phase of the rotary traveling wave oscillator 200 for tuning or other purposes.

The rotary traveling wave oscillator 200 includes a number of different electrical components or devices, such as inverters, capacitors, signal taps, and signal generator circuits or devices. For illustrative purposes, the rotary traveling wave oscillator 200 will be described with reference to specific configurations of these different electrical components or devices. However, other specific electrical components or configurations may be used to achieve other desired signal or conversion characteristics. It is not required that the exact components or devices described be used in the present invention and such components or devices are used to illustrate various embodiments and not to limit the present invention.

The rotary traveling wave oscillator 200 includes a transmission line 202 disposed in a looped configuration for conducting an oscillating signal thereon. The signal may travel in either a clockwise or counter-clockwise direction around the looped configuration of the transmission line 202. A crossover 206 is disposed at a location along the transmission line 202 and acts to divide the looped configuration into two portions. The looped configuration of the transmission line 202 has predetermined circumference (e.g., via a physical layout out on a printed circuit board) that corresponds or is equal to half a wavelength of the signal that is conducted along the transmission line 202. Thus, the signal travels along the transmission line 202 around a first loop portion before the crossover 206 for the first half of its wavelength, subsequently travels along the crossover 206 and finally travels along the transmission line 202 around the second loop portion after the crossover 206 for the second half of its wavelength, thus completing a full cycle for every two trips around the circumference of the transmission line 202.

In order to provide power for maintaining the signal traveling on the transmission line 202 of the rotary traveling wave oscillator 200, a plurality of back-to-back inverters (210, 212, 214, 216, 218, 220, 222, 224) are disposed around the looped configuration of the transmission line 202 and electrically connect with the transmission line 202 at various points along its circumference. The inverters (210, 212, 214, 216, 218, 220, 222, 224) are selected so as to aid in overcoming losses associated with propagation of the signal along the transmission line 202. A plurality of tuning capacitors (230, 232, 234) are also disposed around the looped configuration of the transmission line 202 and electrically connect with the transmission line 202 at various points along its circumference. Each of the tuning capacitors (230, 232, 234) has a variable capacitance and is configured to receive a frequency tune signal 236 for adjusting or maintaining a desired frequency of the signal of the rotary traveling wave oscillator 200. In one embodiment, the tuning capacitors (230, 232, 234) may be veractors, their capacitance adjusted based upon a voltage level of the frequency tune signal 236. The frequency tune signal 236 may be determined or generated based on an estimation of a phase of the rotary traveling wave oscillator 200, the same or similar as previously described in FIG. 1.

In order to determine the phase of the rotary traveling wave oscillator 200, a plurality of signal taps (240, 242, 244, 246) are disposed around the looped configuration of the transmission line 202 and electrically connect with the transmission line 202. The signal taps (240, 242, 244, 246) operate to sample a time waveform of the signal traveling around the transmission line 202 and provides these samples as a digital representation of the phase to the digital logic circuitry 204 for decoding the digital representation, as described in greater detail herein. Each of the signal taps (240, 242, 244, 246) samples or latches the signal present at the signal tap (240, 242, 244, 246) location on the transmission line 202 in response to sample clock signals 248, as described in greater detail herein. The phase quantization of a rotary traveling wave oscillator utilizing one or more signal taps is shown according to the following equation:

$$\delta\theta = 360°/(2*N)$$

wherein $\delta\theta$ is the phase quantization and N is the total number of signal taps disposed along the oscillator.

Thus, for the rotary traveling wave oscillator 200 utilizing four signal taps (240, 242, 244, 246), as shown in FIG. 2, the phase quantization is 45 degrees. Accordingly, the phase locations are representative of 0, ±45, ±90, ±135 and 180 degrees for the signal travelling on the transmission line 202. In an alternative embodiment, any number of signal taps may be used for sampling the time waveforms of the signal (e.g., 32 to 64 signal taps may be utilized). A greater number of signal taps allows for finer phase quantization, but at increased circuit complexity or manufacturing expense. Moreover, since the circumference of the looped configuration of the transmission line 202 impacts the frequency of operation of the rotary traveling wave oscillator 200, the addition of signal taps can become increasingly difficult or even impossible for certain frequencies due to circuit component sizing. For example, 128 signal taps may consume too much physical real estate on an integrated circuit or a printed circuit board, such that a desired circumference of a transmission line for a particular frequency of operation cannot adequately accommodate the signal taps. As such, the maximum resolution or phase quantization may be limited by the physical circuit components forming the rotary traveling wave oscillator 200. However, by manipulating the sampling process of the signal via the signal taps (240, 242, 244, 246), as described in greater detail herein, the resolution or phase quantization may increased beyond traditional phase to digital conversion circuits.

Figure 3A:
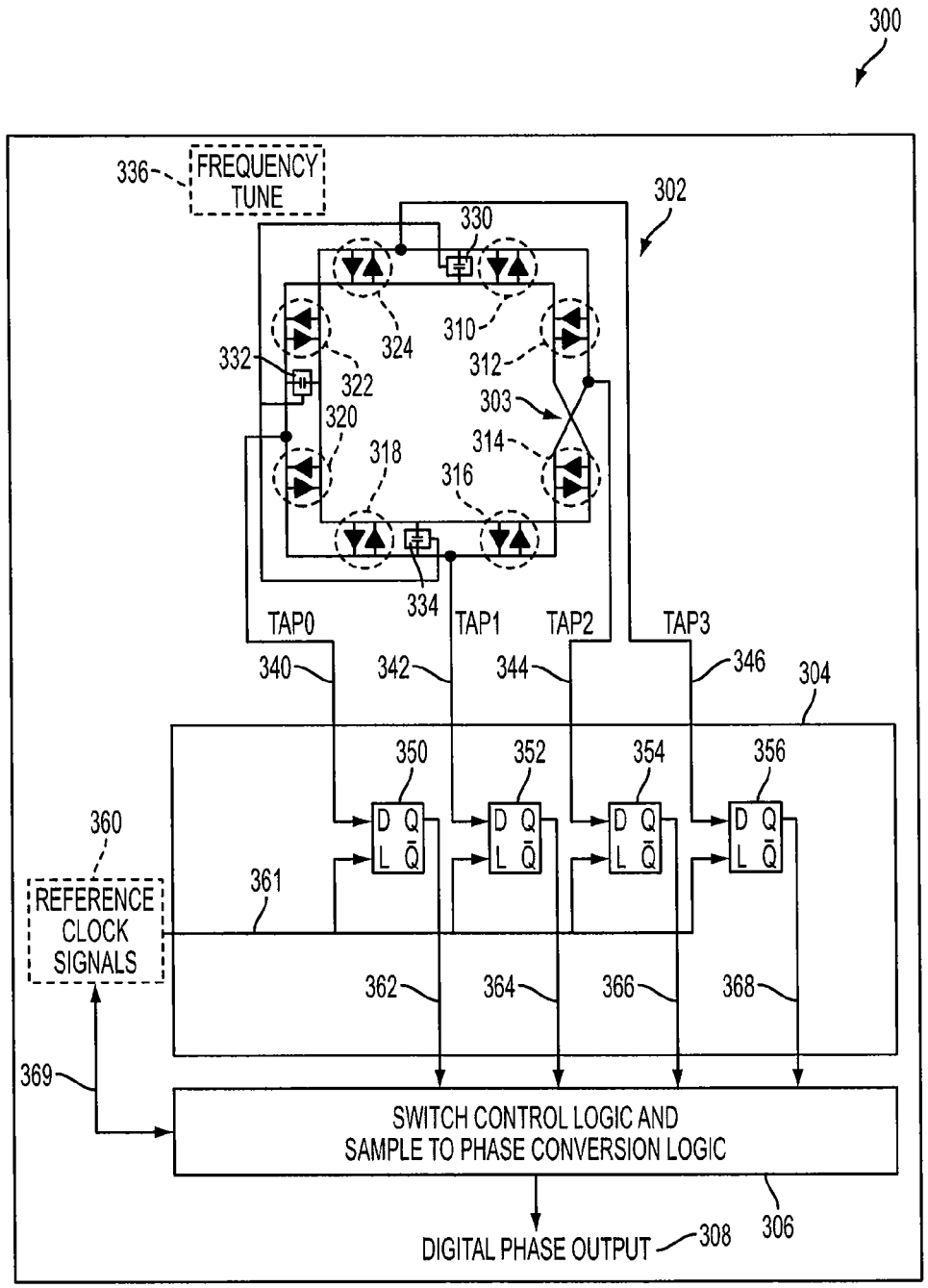
FIG. 3A is a schematic circuit diagram of a rotary traveling wave oscillator connected with phase to digital conversion circuitry in accordance with an embodiment of the invention.

FIG. 3A shows a schematic circuit diagram 300 of a rotary traveling wave oscillator connected with phase to digital conversion circuitry in accordance with an embodiment of the invention. Generally, the rotary traveling wave oscillator shown in the schematic circuit diagram 300 may have certain structural configurations and features that are the same or similar to those of the rotary traveling wave oscillator 200. The rotary traveling wave oscillator includes a looped transmission line 302 with a crossover 303, a plurality of inverters (310, 312, 314, 316, 318, 320, 322, 324) and a plurality of adjustable capacitances (330, 332, 334) and a corresponding frequency tune signal 336, the same or similar as previously described for FIG. 2. Phase to digital sampling circuitry 304 for generating a digital representation estimating a phase of the rotary traveling wave oscillator 300 is illustrated in greater detail than in FIG. 2 for describing the functional operation of the phase to digital conversion of the schematic circuit diagram 300.

A first latch 350 (e.g., a D flip-flop) has a first terminal, a second terminal and a third terminal. The first terminal of the first latch 350 electrically connects to the transmission line 302 at a first location via a first signal line 340 (i.e., TAP0). Thus, a first tapped signal is received at the first terminal of the first latch 350 based on the oscillating signal conducting on the transmission line 302 during operation of the rotary traveling wave oscillator.

Similarly, a second latch 352 has a first terminal, a second terminal and a third terminal. The first terminal of the second latch 352 electrically connects to the transmission line 302 at a second location via a second signal line 342 (i.e. TAP1). Thus, a second tapped signal is received at the first terminal of the second latch 352 based on the oscillating signal conducting on the transmission line 302 during operation of the rotary traveling wave oscillator 300. Due to the phase quantization of the rotary traveling wave oscillator, the second tapped signal is the first tapped signal shifted or offset by 45 degrees. In an alternative embodiment, this shift or offset may vary depending upon the number of signal taps utilized.

A third latch 354 also has a first terminal, a second terminal and a third terminal. The first terminal of the third latch 354 electrically connects to the transmission line 302 at a third location via a third signal line 344 (i.e. TAP2). Thus, a third tapped signal is received at the first terminal of the third latch 354 based on the oscillating signal conducting on the transmission line 302 during operation of the rotary traveling wave oscillator. Due to the phase quantization of the rotary traveling wave oscillator, the third tapped signal is the first tapped signal shifted or offset by 90 degrees. In an alternative embodiment, this shift or offset may vary depending upon the number of signal taps utilized.

Likewise, a fourth latch 356 also has a first terminal, a second terminal and a third terminal. The first terminal of the fourth latch 356 electrically connects to the transmission line 302 at a fourth location via a fourth signal line 346 (i.e. TAP3). Thus, a fourth tapped signal is received at the first terminal of the fourth latch 356 based on the oscillating signal conducting on the transmission line 302 during operation of the rotary traveling wave oscillator. Due to the phase quantization of the rotary traveling wave oscillator, the fourth tapped signal is the first tapped signal shifted or offset by 135 degrees. In an alternative embodiment, this shift or offset may vary depending upon the number of signal taps utilized.

The plurality of signal lines (340, 342, 344, 346) may have any length for connecting the plurality of latches (350, 352, 354, 356) to the transmission line 302 and may be direct connections of the plurality of latches (350, 352, 354, 356) to the transmission line 302 such that there is a minimal propagation delay of any tapped signals thereon. Due to the propagation time delay of the oscillating signal on the transmission line 302 as it travels around the looped configuration, each of the plurality of latches (350, 352, 354, 356) will receive varying values at their respective first terminals for a given moment of time. As described in greater detail herein, these varying values correspond to the phase of the rotary traveling wave oscillator.

Figure 3B:
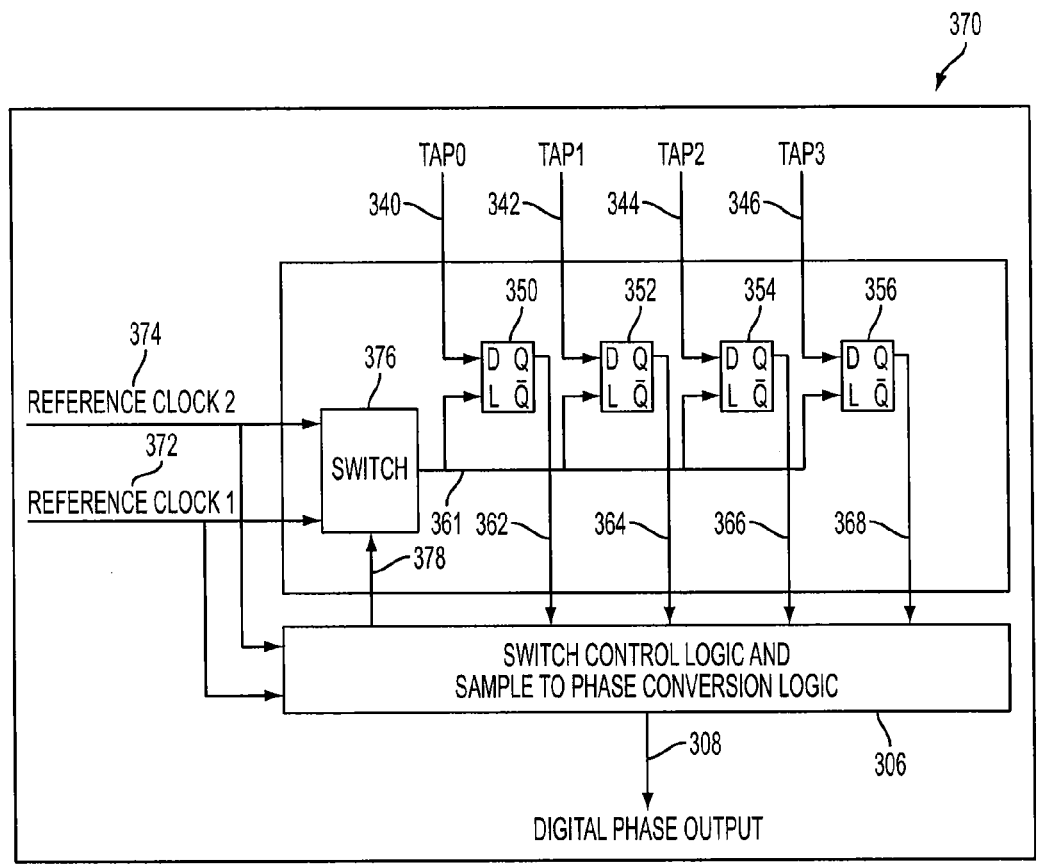
FIG. 3B is a schematic circuit diagram of the phase to digital conversion circuitry of FIG. 3A for connection with a rotary traveling wave oscillator in accordance with an embodiment of the invention.

Reference clock signals 360 are switchably connected via a clocking signal circuit node or path 361 to each of the second terminals of the plurality of latches (350, 352, 354, 356), as described in greater detail for FIG. 3B. The reference clock signals 360 provide a timing mechanism for the latching operation of the plurality of latches (350, 352, 354, 356). Each of the plurality of latches (350, 352, 354, 356) is configured to respond to a change or transition in a particular reference clock signal 360 present on the clocking signal circuit node or path 361. Upon such a change or transition, each of the plurality of latches (350, 352, 354, 356) simultaneously updates or outputs on their respective third terminals a latched state of the tapped signal received at each of their respective first terminals.

Thus, for example, if the first tapped signal on the first signal line 340 represented a HIGH or "1" digital value when a reference clock on the clocked signal circuit node or path 361 transitioned (e.g., exhibited a rising transition edge or low-to-high state change), the first latch 350 would output a first latched signal having a HIGH or "1" digital value at its third terminal. This output is sent to a logic unit 306 via a first output signal circuit node or path 362, as described in greater detail herein. Similarly, if the second tapped signal on the second signal line 342 represented a HIGH or "1" digital value when the reference clock on the clocked signal circuit node or path 361 transitioned, the second latch 352 would output a second latched signal having a HIGH or "1" digital value at its third terminal. This output is also sent to the logic unit 306 via a second output signal circuit node or path 364.

If the third tapped signal on the third signal line 344 represented a LOW or "0" digital value when the reference clock on the clocked signal circuit node or path 361 transitioned, the third latch 354 would output a third latched signal having a LOW or "0" digital value at its third terminal. This output is sent to the logic unit 306 via a third output signal circuit node or path 366. Likewise, if the fourth tapped signal at the fourth signal line 346 represented a LOW or "0" digital value when the reference clock on the clocked signal circuit node or path 361 transitioned, the fourth latch 356 would output a fourth latched signal having a LOW or "0" digital value at its third terminal. This output is sent to the logic unit 306 via a fourth output signal circuit node or path 368. Thus, a 4-bit digital representation of the phase of the rotary traveling wave oscillator is generated via the output signal circuit nodes (362, 364, 366, 368) having the digital string or code:

[1 1 0 0]

Upon another transition of a reference clock on the clocked signal circuit node or path 361, another digital representation of the phase of the rotary traveling wave oscillator will be generated.

The logic unit 306 receives these digital representations and uses sample to phase conversion logic to decode or convert the string or code to an estimate of the phase of the rotary traveling wave oscillator. The decoded estimate of the phase may then be output 308 to any of a variety of electrical circuits or systems, for example, to a loop filter as feedback for ensuring proper operation of the rotary traveling wave oscillator according to designed parameters. The logic unit 306 may also receive additional signals 369 for controlling a switching of the reference clock signals 360 for increasing the resolution of the phase to digital sampling, as described in greater detail for FIG. 3B.

Turning next to FIG. 3B, a schematic circuit diagram 370 is shown of phase to digital conversion circuitry for the rotary traveling wave oscillator 300 of FIG. 3A in order to provide improved resolution. Instead of utilizing only a single reference clock for initiating the latching of the plurality of latches (350, 352, 354, 356), a first reference clock signal 372 and a second reference clock signal 372 are coupled through a switch 376 to the clocked signal circuit node or path 361 for connection to the second terminals of the plurality of latches (350, 352, 354, 356). The use of multiple reference clocks (372, 374) for triggering the latches (350, 352, 354, 356) permits the phase to digital conversion circuitry to sample the tapped signals on the signal lines (340, 342, 344, 346) closer in time to a transition in one of the tapped signals on the signal lines (340, 342, 344, 346).

Each of the tapped signals on the signal lines (340, 342, 344, 346) have transitions between a LOW state and a HIGH state at various moments in time. For example, the first tapped signal on the first signal line 340 may correspond to HIGH or "1" for the first half of its cycle and transition to LOW or "0" for the second half of its cycle. The second tapped signal on the second signal line 342 similarly may correspond to HIGH or "1" for the first half of its cycle and transition to LOW or "0" for the second half of its cycle. However, the second tapped signal is offset from the first tapped signal by 45 degrees, due to the phase quantization of the rotary traveling wave oscillator. The third tapped signal on the third signal line 344 similarly may correspond to HIGH or "1" for the first half of its cycle and transition to LOW or "0" for the second half of its cycle, the third tapped signal being offset from the first tapped signal by 90 degrees. Finally, the fourth tapped signal on the fourth signal line 346 may correspond to HIGH or "1" for the first half of its cycle and transition to LOW or "0" for the second half of its cycle, the fourth tapped signal being offset from the first tapped signal by 135 degrees.

Thus, generating a digital representation from the first, second, third and fourth tapped signals results in an uncertainty of 45 degrees because the 4-bit digital representation will not vary for a range of 45 degrees due to the rough phase quantization. However, improved resolution can be obtained without increasing the number of signal taps by selectively switching between the first reference clock 372 and the second reference clock 374 via the switch 376 based on a transition in the first reference clock 372 or a transition in the second reference clock 374, as described in more detail for FIG. 4. The logic unit 306 receives the first reference clock 372 and the second reference clock 374 and provides a control signal 378 to the switch 376 for controlling the connection of either the first reference clock 372 or the second reference clock 374 to the clocking signal circuit node or path 361.

Figure 4:
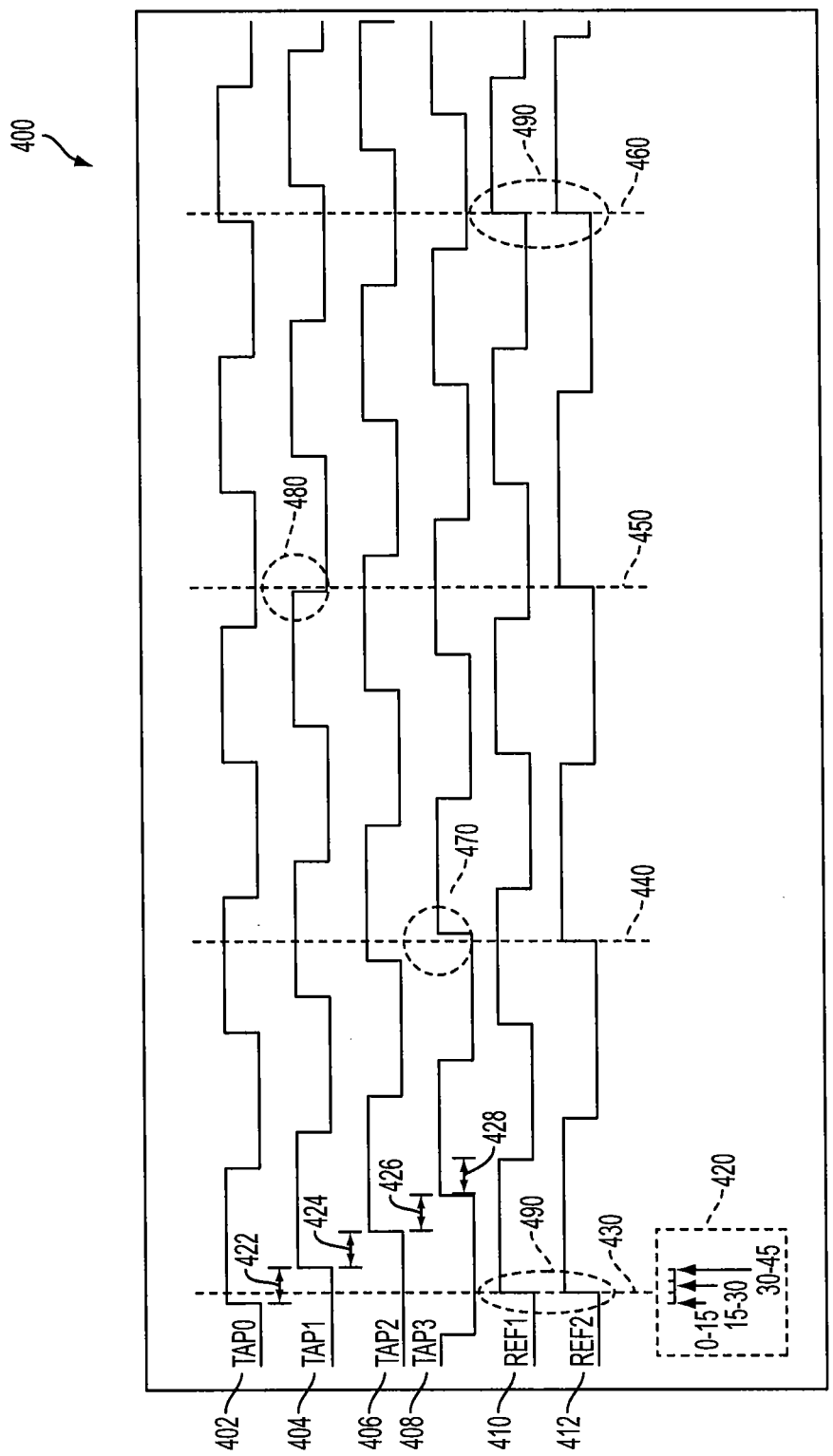
FIG. 4 is a timing diagram of a phase to digital converter for a rotary traveling wave oscillator in accordance with an embodiment of the invention.

Turning next to FIG. 4, a timing diagram 400 is shown for a phase to digital converter. The timing diagram 400 demonstrates the improved resolution obtainable when multiple reference clocks are used for controlling the sampling of a connected rotary traveling wave oscillator. A first tapped signal 402 is shown versus time and corresponds to a signal present at a first location of a looped transmission line of a rotary traveling wave oscillator. The first tapped signal 402 may be the same or similar to the first tapped signal on the first signal line 340 of FIGS. 3A-3B. A second tapped signal 404 is shown versus time and corresponds to a signal present at a second location of a looped transmission line of a rotary traveling wave oscillator. The second tapped signal 404 is delayed in time from the first tapped signal due to the propagation delay of a signal traveling along the looped transmission line from the first location to the second location. The second tapped signal 404 may be the same or similar to the second tapped signal on the second signal line 342 of FIGS. 3A-3B.

A third tapped signal 406 is shown versus time and corresponds to a signal present at a third location of a looped transmission line of a rotary traveling wave oscillator. The third tapped signal 406 is delayed in time from the second tapped signal due to the propagation delay of a signal traveling along the looped transmission line from the second location to the third location. The third tapped signal 406 may be the same or similar to the third tapped signal on the third signal line 344 of FIGS. 3A-3B. A fourth tapped signal 408 is shown versus time and corresponds to a signal present at a fourth location of a looped transmission line of a rotary traveling wave oscillator. The fourth tapped signal 408 is delayed in time from the third tapped signal due to the propagation delay of a signal traveling along the looped transmission line from the third location to the fourth location. The fourth tapped signal 408 may be the same or similar to the fourth tapped signal on the fourth signal line 346 of FIGS. 3A-3B.

For a rotary traveling wave oscillator having 4 signal taps (e.g., see FIGS. 2-3B), the phase quantization is equal to 45 degrees. Thus, a first shift 422 between the rising edge of the first tapped signal 402 and the rising edge of the second tapped signal 424 corresponds to 45 degrees of phase. Similarly, a second shift 424 between the rising edge of the second tapped signal 424 and the rising edge of the third tapped signal 406 corresponds to 45 degrees of phase. A third shift 426 between the rising edge of the third tapped signal 406 and the rising edge of the fourth tapped signal 408 corresponds to 45 degrees of phase shift. A fourth shift 428 between the rising edge of the fourth tapped signal 408 and the falling edge of the first tapped signal 402 corresponds to 45 degrees of phase shift. Four additional shifts likewise correspond to 45 degree phase shifts for the remainder of the full cycle of the signal propagating on the transmission line.

The following table illustrates the digital representations of the phase for a rotary traveling wave oscillator having a phase quantization of 45 degree increments, as shown by FIG. 4:

| DIGITAL REPRESENTATION [402 404 406 408] | PHASE ESTIMATION OF ROTARY TRAVELING WAVE OSCILLATOR |
|---|---|
| [1 0 0 0] | 0-45 degrees |
| [1 1 0 0] | 45-90 degrees |
| [1 1 1 0] | 90-135 degrees |
| [1 1 1 1] | 135-180 degrees |
| [0 1 1 1] | 180-235 degrees |
| [0 0 1 1] | 235-270 degrees |
| [0 0 0 1] | 270-315 degrees |
| [0 0 0 0] | 315-360 degrees |

Thus, sampling the tapped signals (402, 404, 406, 408) to obtain a digital representation of phase yields an uncertainty span of 45 degrees since the digital representation is unchanging. However, this uncertainty can be reduced and the resolution improved by selectively sampling the tapped signals (402, 404, 406, 408) at times in closer proximity to a transition in one of the tapped signals (402, 404, 406, 408), as discussed below.

A first reference clock 410 having a constant first frequency is shown versus time and may be the same or similar to the first reference clock 372 of FIG. 3B. A second reference clock 412 having a constant second frequency is shown versus time and may be the same or similar to the second reference clock 374 of FIG. 3B. While the second frequency is shown to be 0.75 times the first frequency, any difference in frequency may be used in an alternative embodiment. In certain embodiments, the first frequency and the second frequency may be the same, the first reference clock 410 and the second reference clock 412 shifted in time with respect to one another.

At time 430, a transition or rising edge in the first reference clock 410 and a transition or edge in the second reference clock 412 are aligned 490 with each other. The first reference clock 410 is used (e.g., switchably coupled to a plurality of latches) at this time for sampling the tapped signals (402, 404, 406, 408) to obtain a digital representation of:

[1 0 0 0]

As seen by the legend 420, 15 degrees of uncertainty in phase is seen before a change in the first tapped signal 402 would be detected and 30 degrees of uncertainty in phase is seen before a change in the second tapped signal 404 changes value at time 490. The closer a transition edge in the first reference clock 410 to a transition edge in one of the tapped signals (402, 404, 406, 408) the more accurate the phase estimation since smaller deviations in phase will result in changing digital representations.

While one manner of improving a resolution of the phase to digital converter is to increase the frequency of the first reference clock 410 such that its transition edge is placed closer in proximity to a transition edge in one of the tapped signals (402, 404, 406, 408), such a solution can significantly increase the current consumption of the circuit. Instead, by switchably using either the first reference clock 410 or the second reference clock 412 to initiate the sampling of the tapped signals (402, 404, 406, 408) based on the most ideal transition edge, resolution may be improved without additional power consumption. Thus, the first reference clock 410 may be used for sampling of the tapped signals (402, 404, 406, 408) when a transition edge in one of the tapped signals (402, 404, 406, 408) is closer in time or proximity to a transition edge in the first reference clock 410 than to a transition edge in the second reference signal 412. Similarly, the second reference clock 412 may be used for sampling of the tapped signals (402, 404, 406, 408) when a transition edge in one of the tapped signals (402, 404, 406, 408) is closer in time or proximity to a transition edge in the second reference clock 412 than to a transition edge in the first reference signal 410.

For example, at time 440, the second reference clock 412 is used for sampling of the tapped signals (402, 404, 406, 408) instead of the first reference clock 410 due to the close proximity 470 of a transition or rising edge in the second reference clock 412 to a transition or rising edge in the fourth tapped signal 408. At time 450, the second reference clock 412 is again used for sampling of the tapped signals (402, 404, 406, 408) instead of the first reference clock 410 due to the close proximity 480 of a transition or rising edge in the second reference clock to a transition or rising edge in the second tapped signal 480. At time 490, the first reference clock 410 and the second reference clock 412 are again in sync and the sampling process can repeat.

The first reference clock 410 and the second reference clock 412 may have frequencies chosen such that they are synchronous relatively often. The ratio of the frequencies determines the improvement in the resolution of the phase estimation and any frequencies may be chosen for the first reference clock 410 and the second reference clock 412. However, a frequency of the tapped signals (402, 404, 406, 408) that is an even multiple of both the first reference clock 410 and the second reference clock 412 will yield no resolution improvement. In addition, while only two reference clocks are shown, an alternative embodiment may utilize any number of additional reference clocks at various clocking frequencies. Additional reference clocks may provide better phase resolution but at in increased circuit complexity or phase estimation time.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A phase to digital conversion circuit comprising:
   an input line for conducting an input signal, the input signal having a transition;
   a latch having a first terminal, a second terminal and a third terminal, the first terminal of the latch coupled with the signal line for receiving the input signal;
   a first reference signal line for conducting a first reference signal, the first reference signal line switchably coupled with the second terminal of the latch;
   a second reference signal line for conducting a second reference signal, the second reference signal line switchably coupled with the second terminal of the latch; and
   an output signal line coupled with the third terminal of the latch for conducting a latched signal based on the input signal, the latched signal configured to be updated based on a transition in the first reference signal or a transition in the second reference signal.

2. The phase to digital conversion circuit of claim 1 wherein:
   the first reference signal line is configured to be coupled to the second terminal of the latch when the transition in the input signal is closer in time to the transition in the first reference signal than to the transition in the second reference signal; and
   the second reference signal line is configured to be coupled to the second terminal of the latch when the transition in the input signal is closer in time to the transition in the second reference signal than to the transition in the first reference signal.

3. The phase to digital conversion circuit of claim 2 further comprising an oscillator having a transmission line disposed in a looped configuration for conducting an oscillating signal, the input line coupled to the transmission line.

4. The phase to digital conversion circuit of claim 3 wherein the looped configuration of the transmission line has a circumference corresponding to half a wavelength of the oscillating signal.

5. The phase to digital conversion circuit of claim 3 further comprising a logic unit coupled with the output signal line for receiving the latched signal, the logic unit configured to determine a phase of the oscillating signal based on the latched signal.

6. The phase to digital conversion circuit of claim 5 further comprising a switch having a first configuration for coupling the first reference signal line to the second terminal of the latch and a second configuration for coupling the second reference signal line to the second terminal of the latch, the logic unit configured to control the configuration of the switch.

7. The phase to digital conversion circuit of claim 2 wherein the first reference signal has a constant first frequency and the second reference signal has a constant second frequency different from the first frequency.

8. The phase to digital conversion circuit of claim 2 wherein the second reference signal has the same frequency as the first reference signal and wherein the second reference signal is delayed in time from the first reference signal.

9. The phase to digital conversion circuit of claim 1 further comprising a third reference signal line for conducting a third reference signal, the third reference signal line switchably coupled with the second terminal of the latch and wherein the latched signal is configured to be updated based on a transition in the third reference signal, the transition in the first reference signal or the transition in the second reference signal.

10. A phase to digital converter for a rotary traveling wave oscillator comprising:
    an oscillator having a closed loop transmission path;
    a first signal circuit node located at a first location on the transmission path for receiving a first tapped signal;
    a second signal circuit node located at a second location on the transmission path for receiving a second tapped signal;
    a third signal circuit node located at a third location on the transmission path for receiving a third tapped signal;
    a fourth signal circuit node located at a fourth location on the transmission path for receiving a fourth tapped signal;
    a first flip-flop having a first port, a second port and a third port, the first port of the first flip-flop electrically connected with the first signal circuit node;
    a second flip-flop having a first port, a second port and a third port, the first port of the second flip-flip electrically connected with the second signal circuit node;
    a third flip-flop having a first port, a second port and a third port, the first port of the third flip-flop electrically connected with the third signal circuit node;
    a fourth flip-flop having a first port, a second port and a third port, the first port of the fourth flip-flop electrically connected with the fourth signal circuit node;
    a clocking signal circuit node electrically connected with the second port of the first flip-flop, the second port of the second flip-flop, the second port of the third flip-flop and the second port of the fourth flip-flop;
    at least one switch electrically connected to the clocking signal circuit node for switchably conducting a first clocking signal or a second clocking signal to the clocking signal circuit node;
    a first output signal circuit node electrically connected with the third port of the first flip-flop for receiving a first latched signal based on the first tapped signal;
    a second output signal circuit node electrically connected with the third port of the second flip-flop for receiving a second latched signal based on the second tapped signal;

a third output signal circuit node electrically connected with the third port of the third flip-flop for receiving a third latched signal based on the third tapped signal; and a fourth output signal circuit node electrically connected with the third port of the fourth flip-flop for receiving a fourth latched signal based on the fourth tapped signal, wherein the at least one switch is configured to conduct the first clocking signal to the clocking signal circuit node based on a transition between a low state and a high state in the first clocking signal and a transition between a low state and a high state in the second clocking signal.

11. The phase to digital converter of claim 10 wherein the at least one switch is configured to conduct the first clocking signal to the clocking signal circuit node only if the transition in the first clocking signal is closer in proximity than the transition in the second clocking signal to a transition between a low state and a high state in any of the first tapped signal, the second tapped signal, the third tapped signal or the fourth tapped signal.

12. The phase to digital converter of claim 11 further comprising at least one inverter electrically connected with the transmission path for powering a signal traveling on the transmission path and wherein the second tapped signal is the first tapped signal shifted by 45 degrees, the third tapped signal is the first tapped signal shifted by 90 degrees and the fourth tapped signal is the first tapped signal shifted by 135 degrees.

13. The phase to digital converter of claim 12 further comprising at least one variable capacitance electrically connected to the transmission path for tuning a frequency of the signal traveling on the transmission path.

14. The phase to digital converter of claim 13 wherein the variable capacitance is a veractor.

15. The phase to digital converter of claim 14 wherein the veractor is configured to receive a frequency tune signal having a voltage level for adjusting the capacitance of the veractor.

16. The phase to digital converter of claim 15 wherein the voltage level of the frequency tune signal is configured to be adjusted based on the first latched signal, the second latched signal, the third latched signal and the fourth latched signal.

17. A method of increasing a resolution of phase to digital conversion for a rotary traveling wave oscillator, the method comprising the steps of:

providing a tapped signal circuit node, a first reference signal circuit node and a second reference signal circuit node;

providing a latch having a first terminal, a second terminal and a third terminal, the first terminal of the latch connected to the tapped signal circuit node;

receiving a tapped signal on the tapped signal circuit node, the tapped signal having a transition edge located at a first transition time;

receiving a first reference signal on the first reference signal circuit node, the first reference signal having a transition edge located at a second transition time;

receiving a second reference signal on the second reference signal circuit node, the second reference signal having a transition edge located at a third transition time;

connecting the first reference signal circuit node to the second terminal of the latch based on the first transition time, the second transition time and the third transition time; and outputting a latched signal based on the tapped signal from the third terminal of the latch at the second transition time.

18. The method of claim 17 further comprising the steps of:

determining a first offset between first transition time and the second transition time; and determining a second offset between the first transition time and the third transition time, wherein the first reference signal circuit node is connected to the second terminal of the latch only if the first offset is less than the second offset.

19. The method of claim 18 further comprising the steps of providing a third reference signal circuit node;

receiving a third reference signal on the third reference signal circuit node, the third reference signal having a transition edge at a fourth transition time; and determining a third offset between the first transition time and the fourth transition time, wherein the first reference signal circuit node is connecting to the second terminal of the latch only if the first offset is less than the third offset.

20. The method of claim 17 wherein the first reference signal has a constant first frequency and the second reference signal has a constant second frequency different than the first frequency.

* * * * *